United States Patent
Namkung et al.

(10) Patent No.: US 10,915,144 B2
(45) Date of Patent: Feb. 9, 2021

(54) FLEXIBLE DISPLAY DEVICE

(71) Applicant: Samsung Display Co., Ltd., Yongin-si (KR)

(72) Inventors: Jun Namkung, Asan-si (KR);
Soonryong Park, Sejong (KR);
Chulwoo Jeong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/785,198

(22) Filed: Oct. 16, 2017

(65) Prior Publication Data

US 2018/0067522 A1 Mar. 8, 2018

Related U.S. Application Data

(63) Continuation of application No. 15/335,061, filed on Oct. 26, 2016, now Pat. No. 9,811,120, which is a
(Continued)

(30) Foreign Application Priority Data

Nov. 28, 2013 (KR) ........................ 10-2013-0146426

(51) Int. Cl.
*G06F 1/16* (2006.01)
*H05K 1/02* (2006.01)
(Continued)

(52) U.S. Cl.
CPC ...... *G06F 1/1652* (2013.01); *G02F 1/133305* (2013.01); *H05K 1/028* (2013.01); *H01L 27/3244* (2013.01); *H01L 2251/5338* (2013.01); *H05K 2201/055* (2013.01); *H05K 2201/09036* (2013.01); *H05K 2201/09845* (2013.01); *H05K 2201/10106* (2013.01); *H05K 2201/10128* (2013.01)

(58) Field of Classification Search
CPC .......................... G02F 1/133305; H05K 1/028
See application file for complete search history.

(56) References Cited

U.S. PATENT DOCUMENTS 6,377,324 B1 4/2002 Katsura
7,242,398 B2 7/2007 Nathan et al.
(Continued)

FOREIGN PATENT DOCUMENTS

GB 2197810 A 6/1988
JP 4777338 B2 7/2011
(Continued)

*Primary Examiner* — Nathan Milakovich
(74) *Attorney, Agent, or Firm* — Lewis Roca Rothgerber Christie LLP

(57) ABSTRACT

A flexible display device includes a flexible display panel and a first outer member having a groove pattern. The first groove pattern includes: a first inclined portion having a first surface inclined to the surface of the display panel at an obtuse angle relative to the surface of the display panel; and a second inclined portion spaced apart from the first inclined portion in a second direction crossing the first direction, the second inclined portion having a second surface inclined to the surface of the display panel at an obtuse angle relative to the surface of the display panel.

10 Claims, 11 Drawing Sheets

Related U.S. Application Data continuation-in-part of application No. 14/298,792, filed on Jun. 6, 2014, now Pat. No. 9,485,858.

(51) Int. Cl.
*G02F 1/1333* (2006.01)
*H01L 27/32* (2006.01)

(56) References Cited

U.S. PATENT DOCUMENTS

| | | | | |
|---|---|---|---|---|
| 8,294,869 | B2 * | 10/2012 | Yamaguchi | G02F 1/133305 349/158 |
| 9,048,443 | B2 | 6/2015 | Namkung et al. | |
| 9,196,848 | B2 | 11/2015 | Namkung et al. | |
| 9,274,559 | B2 | 3/2016 | Prushinskiy et al. | |
| 9,324,959 | B2 | 4/2016 | Namkung et al. | |
| 9,485,858 | B2 * | 11/2016 | Namkung | H05K 1/028 |
| 9,515,099 | B2 * | 12/2016 | Kwon | H01L 27/1244 |
| 9,645,613 | B2 * | 5/2017 | Nam | G06F 1/1652 |
| 9,773,853 | B2 * | 9/2017 | Tao | H01L 27/3297 |
| 9,811,120 | B2 * | 11/2017 | Namkung | G02F 1/133305 |
| 10,056,444 | B2 * | 8/2018 | Cho | H01L 27/3258 |
| 10,069,107 | B2 * | 9/2018 | Jeon | H01L 51/5253 |
| 10,141,540 | B2 * | 11/2018 | Sung | H01L 51/5253 |
| 10,295,818 | B2 * | 5/2019 | Nam | G02B 26/005 |
| 10,429,895 | B2 * | 10/2019 | Lee | G06F 1/1652 |
| 10,600,989 | B1 * | 3/2020 | Ai | H01L 51/524 |
| 10,615,366 | B2 * | 4/2020 | Han | H01L 27/3244 |
| 10,691,175 | B2 * | 6/2020 | Lee | G06F 1/1643 |
| 10,748,973 | B2 * | 8/2020 | Han | H01L 27/3244 |
| 2008/0055831 | A1 * | 3/2008 | Satoh | G02F 1/133305 361/600 |
| 2009/0021666 | A1 * | 1/2009 | Chen | G02F 1/133305 349/58 |
| 2012/0307423 | A1 * | 12/2012 | Bohn | G06F 1/1641 361/679.01 |
| 2013/0034685 | A1 | 2/2013 | An et al. | |
| 2013/0169515 | A1 * | 7/2013 | Prushinskiy | G06F 1/1652 345/55 |
| 2014/0029212 | A1 | 1/2014 | Hwang et al. | |
| 2014/0042406 | A1 * | 2/2014 | Degner | H01L 27/326 257/40 |
| 2014/0240985 | A1 * | 8/2014 | Kim | H05K 1/028 362/249.04 |
| 2014/0268780 | A1 * | 9/2014 | Wang | F21S 4/22 362/249.06 |
| 2015/0014644 | A1 | 1/2015 | Namkung et al. | |
| 2015/0102298 | A1 * | 4/2015 | Namkung | H01L 51/0097 257/40 |
| 2015/0144921 | A1 | 5/2015 | Lim et al. | |
| 2015/0210590 | A1 | 7/2015 | Chang et al. | |
| 2015/0227172 | A1 | 8/2015 | Namkung et al. | |
| 2015/0313004 | A1 | 10/2015 | Namkung et al. | |
| 2015/0327355 | A1 * | 11/2015 | Wolfel | H05K 1/0278 174/251 |
| 2016/0007441 | A1 | 1/2016 | Matsueda | |
| 2017/0263887 | A1 * | 9/2017 | Han | H01L 27/3276 |
| 2019/0074469 | A1 * | 3/2019 | Kwon | H01L 27/3244 |
| 2019/0237532 | A1 * | 8/2019 | Ahn | H05K 1/028 |

FOREIGN PATENT DOCUMENTS

| | | |
|---|---|---|
| JP | 2011-237661 | 11/2011 |
| KR | 2000-0071067 A | 11/2000 |
| KR | 10-2006-0123597 | 12/2006 |
| KR | 10-2013-0015230 A | 2/2013 |
| KR | 10-2013-0076402 | 7/2013 |
| KR | 10-2015-0007632 | 1/2015 |
| NO | WO 2006/090434 A1 | 8/2006 |

* cited by examiner

FLEXIBLE DISPLAY DEVICE

CROSS-REFERENCE TO RELATED APPLICATION

This application is a continuation of U.S. patent application Ser. No. 15/335,061, filed Oct. 26, 2016, which is a continuation-in-part of U.S. patent application Ser. No. 14/298,792, filed Jun. 6, 2014, now U.S. Pat. No. 9,485,858, which claims priority to and the benefit of Korean Patent Application No. 10-2013-0146426, filed Nov. 28, 2013 in the Korean Intellectual Property Office, the entire contents of all of which are incorporated herein by reference.

BACKGROUND

1. Field of the Invention

The present disclosure relates to a display device. More particularly, the present disclosure relates to a flexible display device.

2. Description of the Related Art

In recent years, a flexible display device, which is formed of a flexible material, e.g., plastic, to maintain display performance thereof even though it is bent as if paper is folded, has been actively researched. The flexible display device has been spotlighted as a next generation display device to replace various electronic equipments, such as a portable computer, an electronic newspaper, a smart card, a printed media, etc.

The flexible display device includes a flexible display panel. The flexible display panel includes a display area displaying an image and a non-display area surrounding the display area. The non-display area includes various circuit parts and line parts to apply image signals to the display area and is positioned at the same plane as the display area.

To minimize the size of the non-display area in a plan view, the flexible display panel is curved in a direction opposite to a direction in which the image is displayed in the display area or the non-display area. Cracks occur in the line parts when the flexible display panel is curved.

SUMMARY

The present disclosure provides a flexible display device capable of reducing defects therein.

Embodiments of the inventive concept provide a flexible display device comprising a flexible display panel comprising a folding area and a peripheral area, and a first outer member on a surface of the flexible display panel and comprising a first groove pattern extending in a first direction at the folding area, wherein the first groove pattern comprises, a first inclined portion having a first surface inclined to the surface of the display panel, and a second inclined portion spaced apart from the first inclined portion in a second direction crossing the first direction, the second inclined portion having a second surface inclined to the surface of the display panel, wherein a width of the first groove pattern satisfies the Formula $$W=F+(S1+S2)=\pi \times R$$

and wherein W denotes the width of the first groove pattern, F denotes a distance between the first inclined portion and the second inclined portion in the second direction, S1 denotes a width of the first inclined portion in the second direction, S2 denotes a width of the second inclined portion in the second direction, $\pi$ denotes a circular constant, and R denotes a radius of curvature of the flexible display panel at the folding area.

In an exemplary embodiment, the first groove pattern exposes a portion of the surface of the display panel, and the distance between the first inclined portion and the second inclined portion in the second direction is defined as width of the portion of the surface of the display panel in the second direction.

In an exemplary embodiment, the first groove pattern further comprises a flat portion parallel to the surface of the display panel and connects to the first inclined portion and the second inclined portion, and the distance between the first inclined portion and the second inclined portion is defined as width of the flat portion in the second direction.

In an exemplary embodiment, the flat portion has a rough surface.

In an exemplary embodiment, the width of each of the first and second inclined portions is about 1 um to about 3 mm.

In an exemplary embodiment, each of the first and the second surfaces forms an obtuse angle with the surface of the display panel.

In an exemplary embodiment, at least one of the first and the second surfaces comprises a flat surface.

In an exemplary embodiment, at least one of the first and the second surfaces comprises a curved surface.

In an exemplary embodiment, at least one of the first and the second surfaces comprises a plurality of inclined surfaces arrayed in a direction parallel to the second direction.

In an exemplary embodiment, a respective angle between each of the plurality of the inclined surfaces and the surface of the display panel become greater as the inclined surfaces are closer to the peripheral area in a plan view.

In an exemplary embodiment, the respective angle between each of the plurality of the inclined surfaces and the surface of the display panel is greater than about 90 degrees.

In an exemplary embodiment, each of the first and second inclined portions comprises a step pattern comprising a plurality of stepped portions.

In an exemplary embodiment, the flexible display panel is folded at the folding area around the first direction.

In an exemplary embodiment, the flexible display panel has a rectangular shape and the folding area extends along at least one edge of the flexible display panel.

In an exemplary embodiment, the flexible display panel is folded at an angle of about 180 degrees.

In an exemplary embodiment, the first groove pattern is at one or more positions at the folding area as first groove patterns.

In an exemplary embodiment, further comprising a second outer member on another surface of the flexible display panel and facing the first outer member, wherein the second outer member comprises a second groove pattern.

In an exemplary embodiment, the first groove pattern is at the folding area and the second groove pattern is at another folding area, and the folding area and the other folding area are at different locations.

In an exemplary embodiment, the flexible display panel is folded in different directions at the folding area and the other folding area.

In an exemplary embodiment, the second groove pattern extends in a direction parallel to the first direction.

According to the above, the signal lines may be prevented from being cracked even though the flexible display panel is folded.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
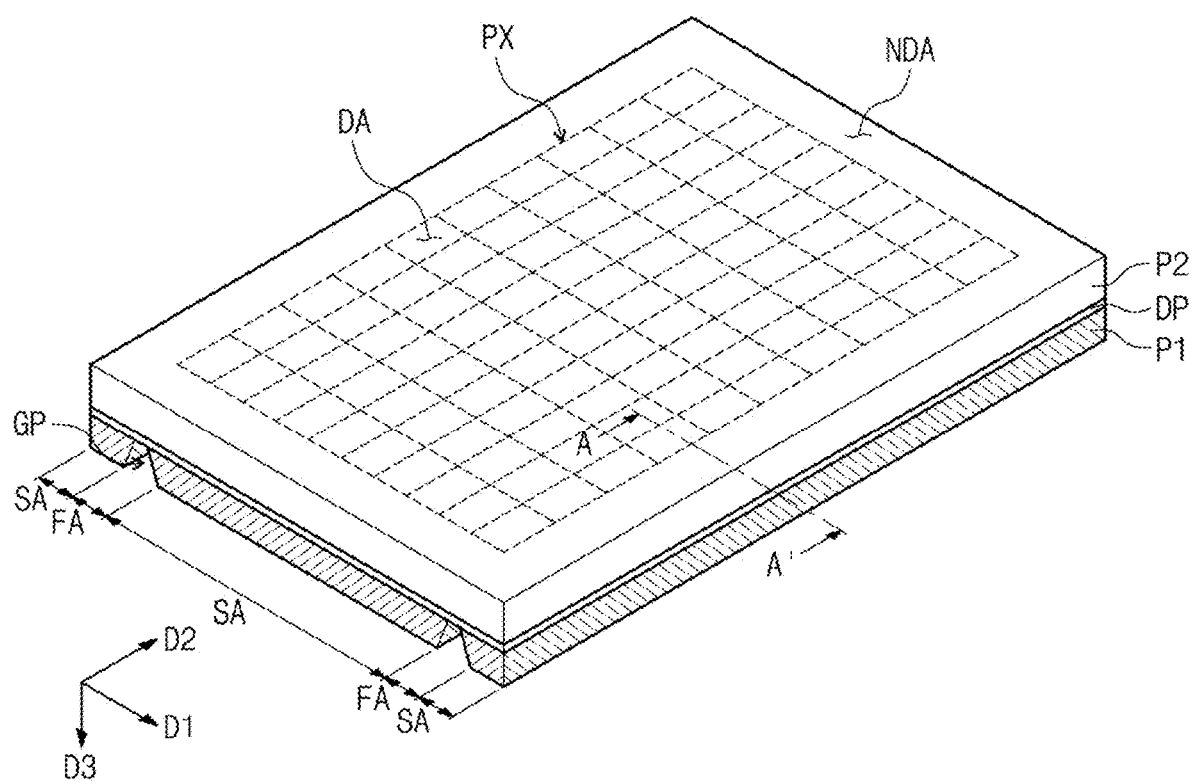
FIG. 1 is a perspective view showing a flexible display device according to an exemplary embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

Like numbers refer to like elements throughout. In the drawings, the thickness of layers, films, and regions are exaggerated for clarity. As used herein, the term "and/or" includes any and all combinations of one or more of the associated listed items. The use of the terms first, second, etc. do not denote any order or importance, but rather the terms first, second, etc. are used to distinguish one element from another. Thus, a first element, component, region, layer or section discussed below could be termed a second element, component, region, layer or section without departing from the teachings of the present invention. It is to be understood that the singular forms "a," "an," and "the" include plural referents unless the context clearly dictates otherwise.

Hereinafter, the present invention will be explained in detail with reference to the accompanying drawings.

FIG. 1 is a perspective view showing a flexible display device according to an exemplary embodiment of the present disclosure.

Referring to FIG. 1, the flexible display device includes a flexible display panel DP, a first outer member P1 disposed on one surface of the flexible display panel DP, and a second outer member P2 disposed on the other surface of the flexible display panel DP.

For the convenience of explanation, a direction in which an image is displayed in the display device is referred to as an upper direction and a direction opposite to the upper direction is referred to as a lower direction, but they should not be limited thereto or thereby.

The flexible display panel DP displays the image. The flexible display panel DP may be an organic light emitting display panel or a plasma display panel, but it should not be limited thereto or thereby. That is, the flexible display panel DP may be a liquid crystal display panel, an electrowetting display panel, an electrophoretic display panel, or a microelectromechanical system (MEMS) display panel. In the present exemplary embodiment, the organic light emitting display panel will be described as the flexible display panel DP as a representative example.

The flexible display panel DP includes a display area DA in which the image is displayed and a non-display area NDA disposed at a position adjacent to at least one side of the display area DA.

The flexible display panel DP includes a flexible substrate, signal lines disposed on the flexible substrate, and pixels PX electrically connected to the signal lines. The pixels PX generate the image on the basis of the signals provided from the signal lines.

The flexible display panel DP has a rectangular shape with two pairs of sides and each pair includes two sides substantially parallel to each other. The sides of one pair of the two pairs are longer than the sides of the other pair of the two pairs. In the present exemplary embodiment, the flexible display panel DP has the rectangular shape defined by a pair of long sides and a pair of short sides, a direction in which the short sides extend is referred to as a first direction D1, and a direction in which the long sides extend is referred to as a second direction D2.

The flexible display panel DP may be curved or wrapped to have a curved surface, or folded in a specific area thereof. The flexible display panel DP includes a folding area FA and a peripheral area SA in a plan view defined by the first direction D1 and the second direction D2. The folding areas FA correspond to areas each in which the flexible display panel DP is folded. The peripheral areas SA are disposed adjacent to the folding area FA.

FIG. 1 shows the flexible display panel DP including two folding areas FA and three peripheral areas SA, but the number of the folding areas FA and the peripheral areas SA should not be limited thereto or thereby. That is, at least one folding area FA may be provided along at least one edge of the flexible display panel DP. In addition, the folding area FA may be provided in a center portion of the flexible display panel DP rather than the edge of the flexible display panel DP if necessary.

The folding areas FA and the peripheral areas SA may include a portion of the pixels PX. The folding areas FA and the peripheral areas SA may display the image regardless of the areas. The peripheral areas SA may be flat or slightly curved.

The first outer member P1 is disposed on the surface of the flexible display panel DP. In the present exemplary embodiment, the first outer member P1 is disposed under the flexible display panel DP. The first outer member P1 may include at least one of a polarizing plate and a protective member. In addition, two or more first outer members P1 may be disposed on the surface of the flexible display panel DP. The first outer member P1 is formed of a flexible plastic.

The first outer member P1 includes a groove pattern GP formed at a position corresponding to the folding area FA. FIG. 1 shows two groove patterns GP respectively corresponding to two folding areas FA, but the number of the groove patterns GP should not be limited to two. That is, the groove pattern GP may be provided in a plural number and the groove patterns GP may be disposed to respectively correspond to the folding areas FA. In the case that the plural groove patterns GP are provided, the groove patterns GP may have the same shape or different shapes, and the groove patterns GP may have the same width or different widths.

Although not shown in figures, the flexible display device may further include an adhesive member (not shown) disposed between the flexible display panel DP and the first outer member P1 to attach the flexible display panel DP and the first outer member P1.

The second outer member P2 is disposed on the other surface of the flexible display panel DP to face the first outer member P1. In the present exemplary embodiment, the second outer member P2 is disposed on the flexible display panel DP. The second outer member P2 may include at least one of a polarizing plate, a touch screen, and a protective member. In addition, two or more second outer members P2 may be disposed on the other surface of the flexible display panel DP. The second outer member P2 may further include a functional coating layer, e.g., an anti-fingerprint coating layer, an anti-reflection coating layer, etc. The second outer member P2 may be formed of a flexible plastic material.

Although not shown in figures, the flexible display device may further include an adhesive member (not shown) disposed between the flexible display panel DP and the second outer member P2 to attach the flexible display panel DP and the second outer member P2.

Hereinafter, the flexible organic light emitting display panel will be described in detail with reference to FIGS. 2 to 5. For the convenience of explanation, only one pixel PX will be described as a representative example.

Figure 2:
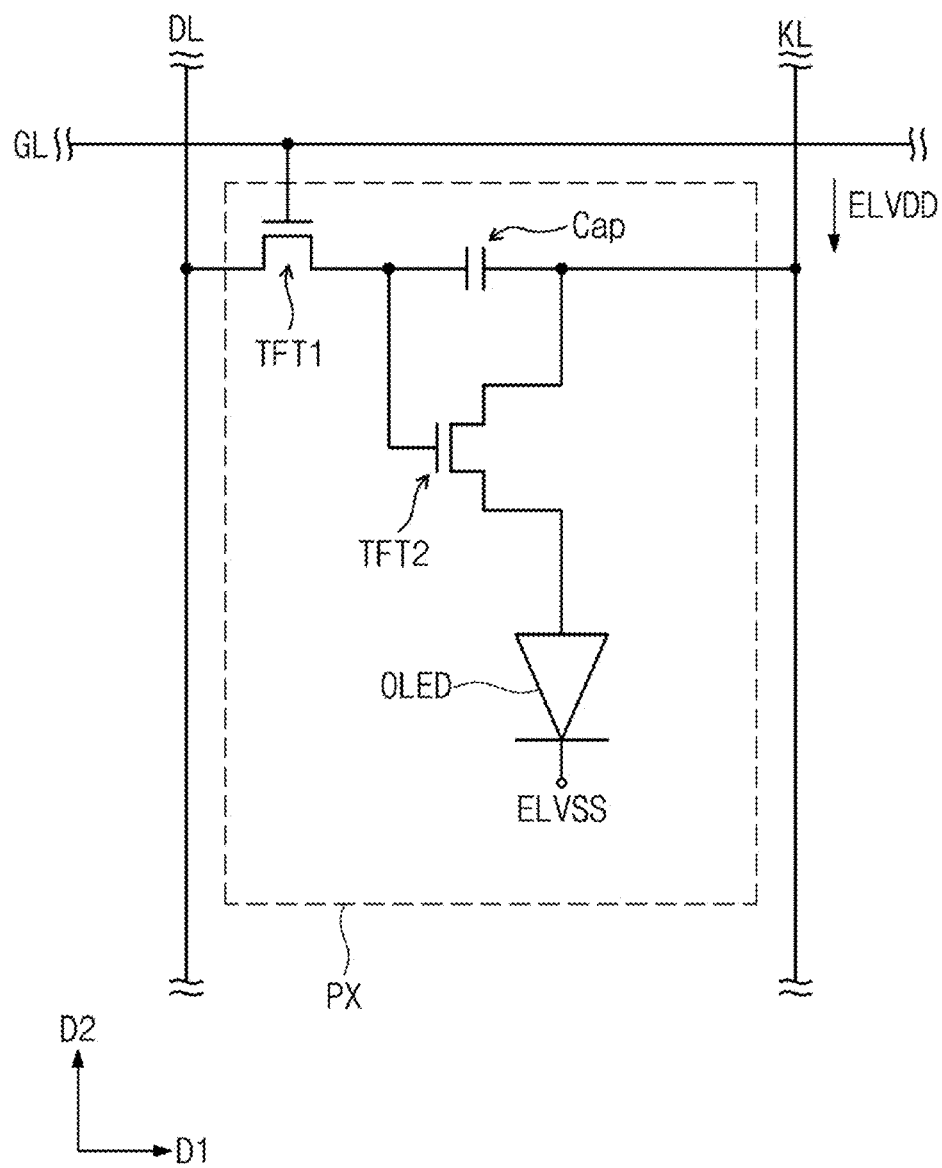
FIG. 2 is an equivalent circuit diagram showing one pixel of the flexible display device shown in FIG. 1.
Figure 3:
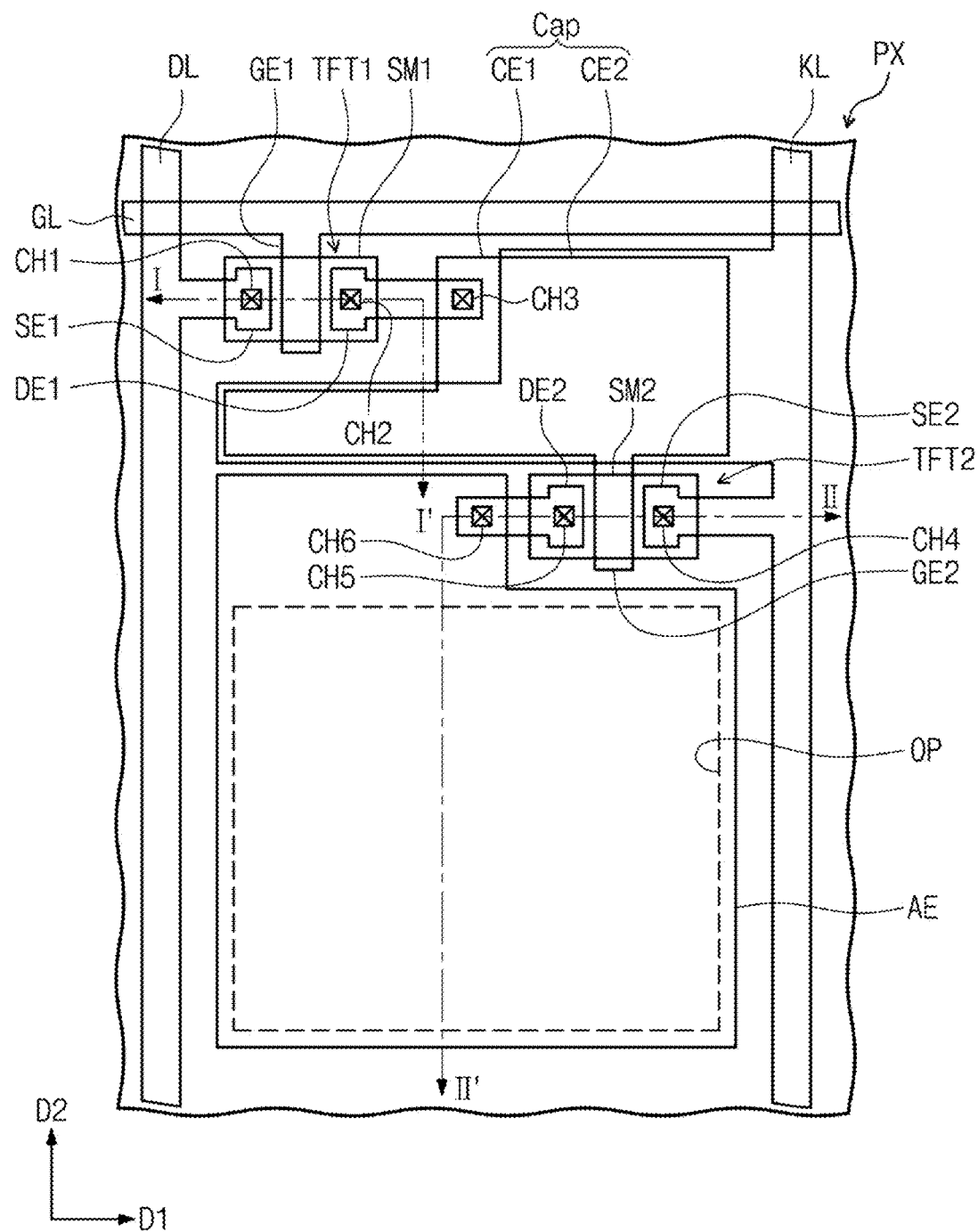
FIG. 3 is a plan view showing the one pixel of the flexible display device shown in FIG. 2.
Figure 4:
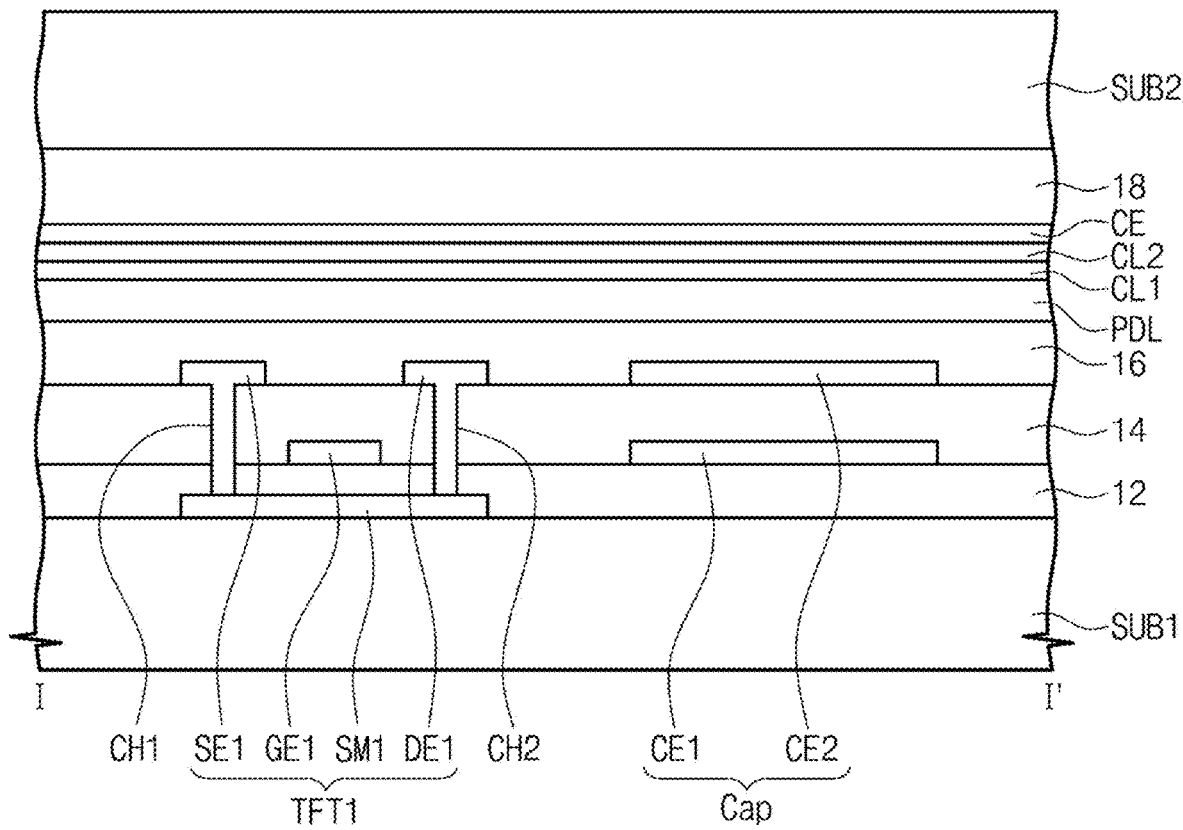
FIG. 4 is a cross-sectional view taken along a line I-I' of FIG. 3.
Figure 5:
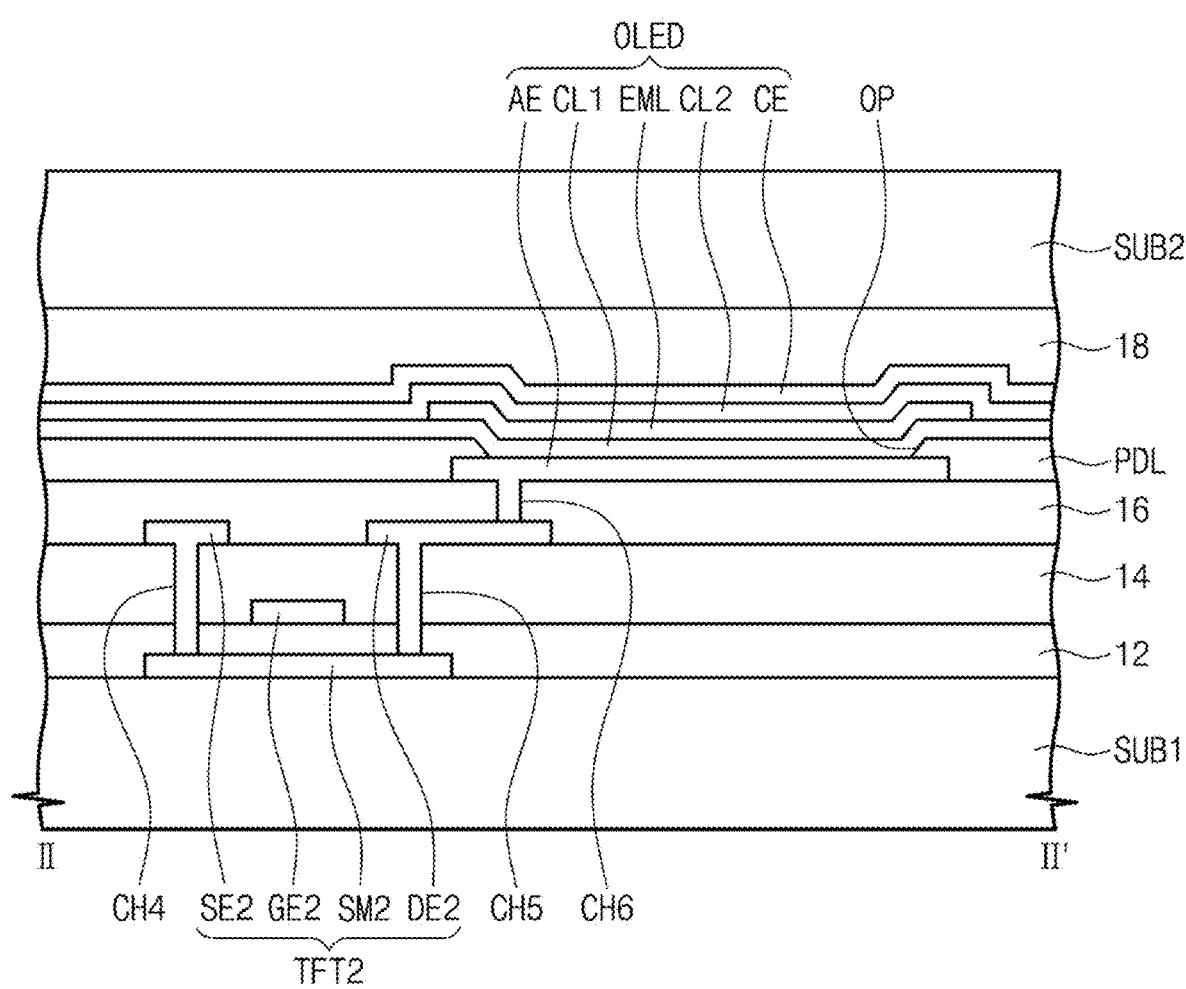
FIG. 5 is a cross-sectional view taken along a line II-II' of FIG. 3.

FIG. 2 is an equivalent circuit diagram showing one pixel of the flexible display device shown in FIG. 1, FIG. 3 is a plan view showing the one pixel of the flexible display device shown in FIG. 2, FIG. 4 is a cross-sectional view taken along a line I-I' of FIG. 3, and FIG. 5 is a cross-sectional view taken along a line II-II' of FIG. 3.

The flexible display panel DP includes a base substrate SUB1 that is flexible, the signal lines disposed on the base substrate SUB1, the pixel PX connected to the signal lines, and a sealing substrate SUB2 disposed on the signal lines and the pixel PX.

The base substrate SUB1 is formed of a plastic material with high thermal resistance and high durability, such as polyethylene terephthalate (PET), polyethylene naphthalate (PEN), polycarbonate (PC), polyarylate (PAR), polyether imide (PEI), polyether sulfone (PES), polyimide (PI), etc., but the material for the base substrate SUB1 should not be limited thereto or thereby.

The flexible display panel DP may further include a barrier layer (not shown) disposed on the base substrate SUB1. The barrier layer (not shown) includes at least one of an organic layer and an inorganic layer. The barrier layer (not shown) prevents foreign substances from entering into the display area DA after passing through the base substrate SUB1.

The signal lines are disposed on the base substrate SUB1 and include a gate line GL extending in the first direction D1, a data line DL extending in the second direction D2 crossing the first direction D1, and a power source line KL receiving a first voltage ELVDD.

The pixel PX is connected to the gate line GL and the data line DL and includes a first thin film transistor TFT1, a second thin film transistor TFT2, a capacitor Cap, and an organic light emitting diode OLED. The first thin film transistor TFT1, the capacitor Cap, and the second thin film transistor TFT2 form a circuit part to control the organic light emitting diode OLED.

The first thin film transistor TFT1 outputs a data signal applied to the data line DL in response to a gate signal applied to the gate line GL. The second thin film transistor TFT2 controls a driving current flowing through the organic light emitting diode OLED in response to an amount of electric charge charged in the capacitor Cap. The pixel PX receives the first voltage ELVDD and a second voltage ELVSS having a different voltage level from that of the first voltage ELVDD.

Hereinafter, a structure of the flexible display panel DP will be described in detail.

A semiconductor pattern SM1 (hereinafter, referred to as a first semiconductor pattern) of the first thin film transistor TFT1 and a semiconductor pattern SM2 (hereinafter, referred to as a second semiconductor patter) of the second thin film transistor TFT2 are disposed on the base substrate SUB1. A first insulating layer 12 is disposed on the base substrate SUB1 to cover the first semiconductor pattern SM1 and the second semiconductor pattern SM2. The first insulating layer 12 includes an organic and/or inorganic layer. The first insulating layer 12 may include a plurality of thin film layers.

A control electrode GE1 (hereinafter, referred to as a first control electrode) of the first thin film transistor TFT1 and a control electrode GE2 (hereinafter, referred to as a second control electrode) of the second thin film transistor TFT2 are disposed on the first insulating layer 12. A first electrode CE1 of the capacitor Cap is disposed on the first insulating layer 12.

A second insulating layer 14 is disposed on the first insulating layer 12 to cover the first control electrode GE1, the second control electrode GE2, and the first electrode CE1. The second insulating layer 14 includes an organic and/or inorganic layer. The second insulating layer 14 may include a plurality of thin film layers.

An input electrode SE1 (hereinafter, referred to as a first input electrode) and an output electrode DE1 (hereinafter, referred to as a first output electrode) of the first thin film transistor TFT1 are disposed on the second insulating layer 14. An input electrode SE2 (hereinafter, referred to as a second input electrode) and an output electrode DE2 (hereinafter, referred to as a second output electrode) of the second thin film transistor TFT2 are disposed on the second insulating layer 14. The second input electrode SE2 is connected to the power source line KL. A second electrode CE2 of the capacitor Cap is further disposed on the second insulating layer 14.

The first input electrode SE and the first output electrode DE1 are connected to the first semiconductor pattern SM1 respectively through first and second contact holes CH1 and CH2 formed through the first insulating layer 12 and the second insulating layer 14. The first output electrode DE1 is connected to the first electrode CE1 through a third contact hole CH3 formed through the second insulating layer 14. The second input electrode SE2 and the second output electrode DE2 are connected to the second semiconductor pattern SM2 respectively through fourth and fifth contact holes CH4 and CH5 formed through the first insulating layer 12 and the second insulating layer 14. Meanwhile, according to another embodiment, each of the first and second thin film transistors TFT1 and TFT2 may have a bottom gate structure.

A third insulating layer 16 is disposed on the second insulating layer 14 to cover the first input electrode SE1, the first output electrode DE1, the second input electrode SE2, and the second output electrode DE2. The third insulating layer 16 includes an organic and/or inorganic layer. The third insulating layer 16 may include a plurality of thin film layers.

A pixel definition layer PDL and the organic light emitting diode OLED are disposed on the third insulating layer 16. The organic light emitting diode OLED includes an anode AE, a first common layer CL1, an organic light emitting layer EML, a second common layer CL2, and a cathode CE, which are sequentially stacked one on another. The anode AE is connected to the second output electrode DE2 through a sixth contact hole CH6 formed through the third insulating layer 16. Positions of the anode AE and the cathode CE may be changed with respect to each other in accordance with a direction to which the organic light emitting diode OLED emits the light.

The anode AE is disposed on the third insulating layer 16 and exposed through an opening OP of the pixel definition layer PDL. The first common layer CL1 is disposed on the anode AE. The first common layer CL1 is disposed not only in the light emitting area corresponding to the opening OP but also in the non-light emitting area. That is, the first common layer CL1 is disposed over the entire surface of the base substrate SUB1. The first common layer CL1 includes a hole injection layer. The first common layer CL1 may further include a hole transport layer.

The organic light emitting layer EML is disposed on the first common layer CL1. The organic light emitting layer EML is disposed only in the area corresponding to the opening OP. The second common layer CL2 is disposed on the organic light emitting layer EML. Similar to the first common layer CL1, the second common layer CL2 is disposed over the entire surface of the base substrate SUB1. The second common layer CL2 includes an electron injection layer. The second common layer CL2 may further include an electron transport layer. The cathode CE is disposed on the second common layer CL2. The cathode CE is disposed over the entire surface of the base substrate SUB1.

A fourth insulating layer 18 is disposed on the cathode CE. The fourth insulating layer 18 includes an organic and/or inorganic layer. The fourth insulating layer 18 may include a plurality of thin film layers. The sealing substrate SUB2 is disposed on the fourth insulating layer 18. The sealing substrate SUB2 may be a flexible plastic substrate. The sealing substrate SUB2 may be replaced with a sealing thin film layer.

Figure 6A:
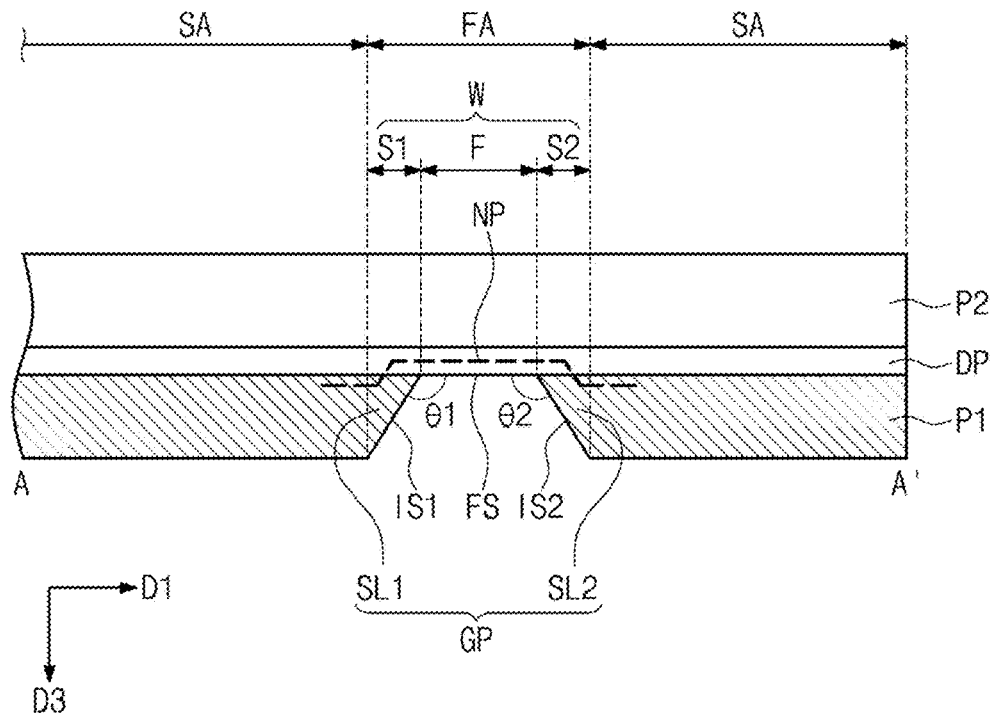
FIG. 6A is a cross-sectional view taken along a line A-A' of FIG. 1.

FIG. 6A is a cross-sectional view taken along a line A-A' of FIG. 1.

Figure 6B:
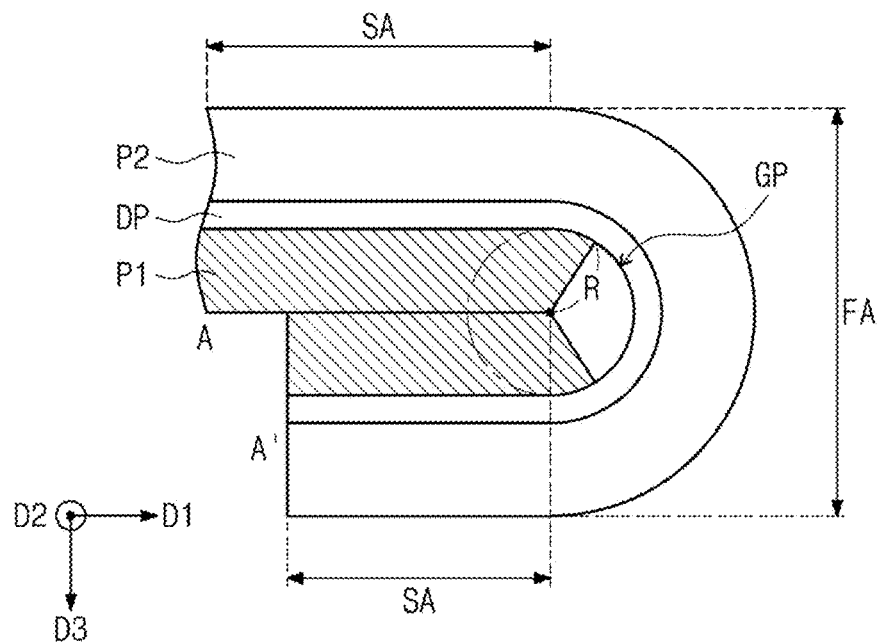
FIG. 6B is a cross-sectional view showing the flexible display device that is folded.

FIG. 6B is a cross-sectional view showing the flexible display device that is folded.

Hereinafter, the flexible display panel according to the exemplary embodiment of the present disclosure will be described in detail with reference to FIGS. 6A-6B. For the convenience of explanation, the first outer member P1 will be mainly described.

Referring to FIG. 6A, the first outer member P1 is disposed under the flexible display panel DP and includes the groove pattern GP formed at the position corresponding to the folding area FA.

The groove pattern GP includes a first inclined portion SL1 and a second inclined portion SL2. The first inclined portion SL1 is spaced apart from the second inclined portion SL2 in the first direction D1.

The first inclined portion SL1 includes a first surface IS1. The first surface IS1 is inclined at a first inclined angle $\theta 1$ with respect to a surface of the flexible display panel DP. The first inclined angle $\theta 1$ may be equal to or greater than about 90 degrees. In the present exemplary embodiment, the first inclined angle $\theta 1$ may be an obtuse angle.

The second inclined portion SL2 includes a second surface IS2. The second surface IS2 is inclined at a second inclined angle $\theta 2$ with respect to the surface of the flexible display panel DP. The second inclined angle $\theta 2$ may be equal to or greater than about 90 degrees. In the present exemplary embodiment, the second inclined angle $\theta 2$ may be an obtuse angle.

The groove pattern GP may be formed by removing at least a portion of the first outer member P1. The first surface IS1, the second surface IS2, and a flat surface FS are exposed by removing the portion of the first outer member P1. Accordingly, the groove pattern GP may have a shape defined by the first surface IS1, the second surface IS2, and the flat surface FS.

The flat surface FS may be a surface disposed between the first surface IS1 and the second surface IS2 to connect the first surface IS1 and the second surface IS2. The flat surface FS may be substantially parallel to the flexible display panel DP, and each of the first surface IS1 and the second surface IS2 may be inclined with respect to the flat surface FS.

The groove pattern GP has a width W in the first direction D1. The width W of the groove pattern GP may be equal to or greater than a width in the first direction D1 of the folding area FA. The width W of the groove pattern GP satisfies the following Formula 1.

$$W = F + (S1 + S2) = \pi \times R \qquad \text{Formula 1}$$

In Formula 1, "F" denotes a separation distance (hereinafter, referred to as a "separation width") in the first direction D1 between the first inclined portion SL1 and the second inclined portion SL2, "S1" denotes a width (hereinafter, referred to as a "first width") in the first direction D1 of the first inclined portion SL1, "S2" denotes a width (hereinafter, referred to as a "second width") in the first direction D1 of the second inclined portion SL2, "π" denotes a circular constant, and "R" denotes a radius of curvature in the folding area FA.

The width W of the groove pattern GP is equal to a sum of the separation width F, the first width S1, and the second width S2. In the present exemplary embodiment, each of the first and second widths S1 and S2 may be equal to or greater than about 1 μm and equal to or smaller than about 3 mm.

In the present exemplary embodiment, the first inclined portion SL1 and the second inclined portion SL2 may expose at least a portion of the surface of the flexible display panel DP. The flat surface FS may correspond to the exposed portion of the surface of the flexible display panel DP. Accordingly, the separation width F may correspond to a width in the first direction D1 of the exposed portion of the surface of the flexible display panel DP.

The width W of the groove pattern GP may be differently designed depending on the radius of curvature R. In addition, the separation width F, the first width S1, and the second width S2 may be differently designed depending on the radius of curvature R.

The flexible display device according to the present exemplary embodiment may be folded at about 180 degrees with respect to a folding axis extending parallel to the second direction D2, and thus the peripheral areas SA disposed adjacent to opposite sides of the folding area FA may be overlapped with each other. A direction in which the groove pattern GP extends may be substantially parallel to the folding axis of the flexible display device. In the present exemplary embodiment, the folding axis may penetrate through a center of a circle defined by the radius of curvature R.

When an external force is applied to the flexible display device according to the present exemplary embodiment in order to fold the flexible display device, the second outer member P2 disposed at an outer side of the folding area FA is applied with a tensile stress and the first outer member P1 disposed at an inner side of the folding area FA is applied with a compression stress. In this case, a neutral plane NP, in which no tensile stress or compression stress occurs, exists between the first outer member P1 and the second outer member P2. When the neutral plane NP is disposed on the flexible display panel DP, the stress applied to the flexible display panel DP is reduced, and thus the flexible display panel DP may be prevented from being damaged while being folded. Accordingly, the groove pattern GP is formed in the folding area FA of the first outer member P1 in order to remove or reduce the compression stress applied to the first outer member P1. When the flexible display device is folded, the groove pattern GP is located at a position at which the compression stress becomes maximum in the folding area FA. Particularly, since the neutral plane NP gradually moves to the flexible display panel DP from the first outer member P1 due to the groove pattern GP formed in the folding area FA, the signal lines may be prevented from being cracked even though the flexible display panel DP is folded.

Figure 7:
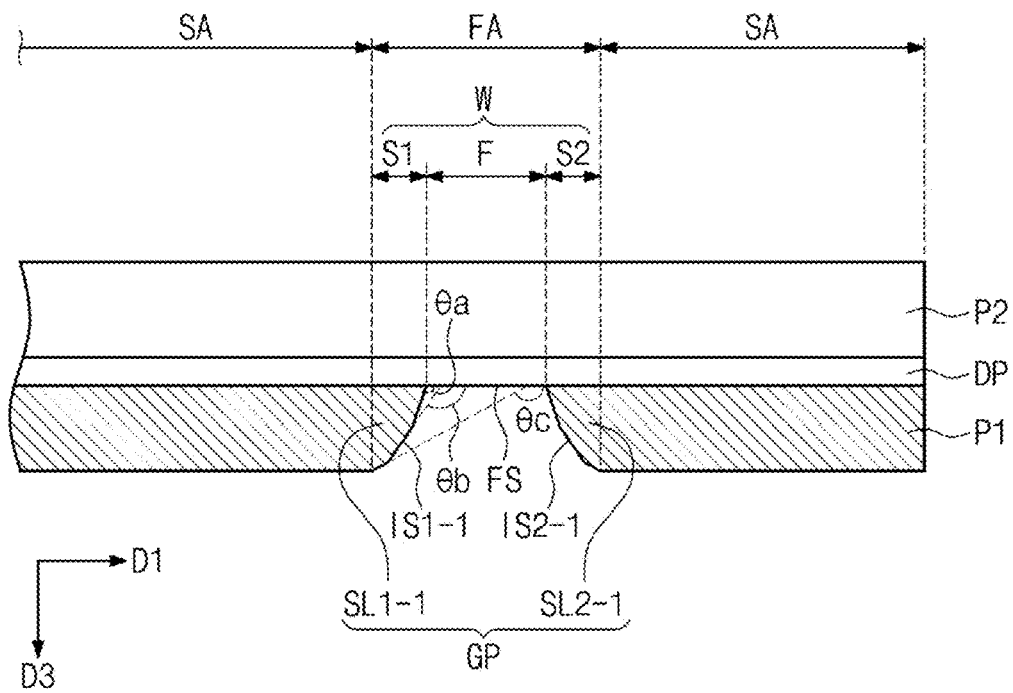
FIG. 7 is a cross-sectional view showing a flexible display device according to another exemplary embodiment of the present disclosure.

FIG. 7 is a cross-sectional view showing a flexible display device according to another exemplary embodiment of the present disclosure. For the convenience of explanation, the same elements will be assigned the same reference numerals, and thus detailed descriptions of the same elements will be omitted.

Referring to FIG. 7, the first outer member P1 is disposed under the flexible display panel DP and includes a groove pattern GP formed in the folding area FA.

The groove pattern GP includes a flat surface FS and a first inclined portion SL1-1 and a second inclined portion SL2-1 respectively connected to the flat surface FS and symmetrical with each other about the flat surface FS. The flat surface FS is defined by removing a portion of the first outer member P1 or by minimizing a thickness of the first outer member P1.

The first and second inclined portions SL1-1 and SL2-1 may respectively include first and second surfaces IS1-1 and IS2-1, each including a plurality of inclined surfaces. The inclined portions may be arranged in the first direction D1.

The first inclined portion SL1-1 includes the inclined surfaces that respectively form first, second, and third angles θa, θb, and θc with the flat surface FS. The first, second, and third angles θa, θb, and θc are equal to or greater than about 90 degrees. The inclined surfaces become farther from the flat surface FS as they go to the third direction D3 in which the inclined portions SL become farther from the flexible display panel DP. That is, the first, second, and third angles θa, θb, and θc satisfy the following Formula 2.

$$90° \leq \theta a \leq \theta b \leq \theta c \leq 180°$$ Formula 2

Here, the first surface IS1-1 includes three inclined surfaces that form the first, second, and third angles θa, θb, and θc with the flat surface FS, but it should not be limited thereto or thereby. That is, the first surface IS1-1 may include at least two inclined surfaces. Meanwhile, the first surface IS1-1 may include a curved surface configured to include a plurality of inclined surfaces at at least a portion of the curved surface.

Meanwhile, the second surface IS2-1 may include a plurality of inclined surfaces arranged in the first direction, and angles between the inclined surfaces and the flat surface FS may be independently designed from the first surface IS1-1.

Accordingly, the first surface IS1-1 and the second surface IS2-1 may have shapes symmetrical with or different from each other. As another way, one surface of the first surface IS1-1 and the second surface IS2-1 may include a plurality of inclined surfaces, and the other surface of the first surface IS1-1 and the second surface IS2-1 may include a single inclined surface. The groove pattern according to the present exemplary embodiment may have various shapes and should not be limited to a specific shape.

A width W of the groove pattern GP is equal to a sum of a separation width F corresponding to a width of the flat surface FS, a first width S1 corresponding to a width of the first inclined portion, and a second width S2 corresponding to a width of the second inclined portion. In the present exemplary embodiment, each of the first width S1 and the second width S2 may be about 1 μm to about 3 mm. The width W of the groove pattern GP may be differently designed depending on the radius of curvature R in the folding area FA when the flexible display device is folded. In addition, the separation width F, the first width S1 and the second width S2 may be differently designed in accordance with the radius of curvature R.

Figure 8:
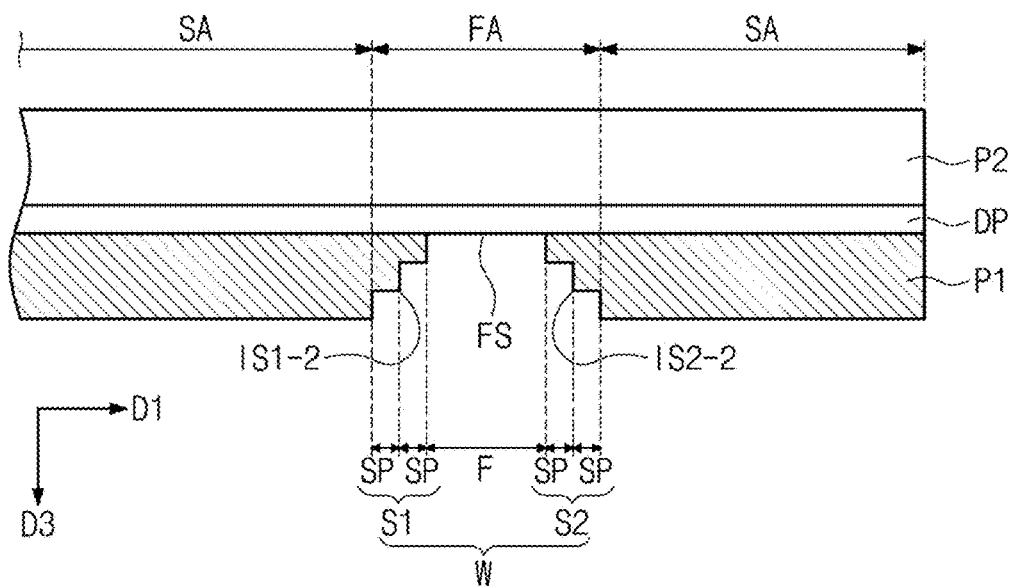
FIG. 8 is a cross-sectional view showing a flexible display device according to another exemplary embodiment of the present disclosure.

FIG. 8 is a cross-sectional view showing a flexible display device according to another exemplary embodiment of the present disclosure.

Referring to FIG. 8, the first outer member P1 is disposed under the flexible display panel DP and includes a groove pattern GP formed in the folding area FA.

The flat surface FS is defined by removing a portion of the first outer member P1 or by minimizing a thickness of the first outer member P1.

The groove pattern GP according to the present exemplary embodiment may be defined by a first surface IS1-2, a second surface IS2-2, and a flat surface FS. Each of the first surface IS1-2 and the second surface IS2-2 may include a plurality of stepped portions SP. A width W of the groove pattern GP satisfies the following Formula 3.

$$W=F+(S1+S2)=F+n\times(SP)=\pi\times R \qquad \text{Formula 3}$$

In Formula 3, "F" denotes a width of the flat surface FS corresponding to the above-mentioned separation width F, "S1" denotes a width (hereinafter, referred to as a "first width") of the first inclined portion, S2 denotes a width (hereinafter, referred to as a "second width") of the second inclined portion, "n" denotes the number of the stepped portions, "SP" denotes a width (hereinafter, referred to as a "third width") of the stepped portion, "π" denotes a circular constant, and "R" denotes a radius of curvature in the folding area FA.

The width W of the groove pattern GP is equal to a sum of the separation width F, the first width S1, and the second width S2. In the present exemplary embodiment, each of the first and second widths S1 and S2 may be about 1 μm to about 3 mm.

Each of the first width S1 and the second width S2 may be equal to a sum of widths in the first direction D1 of the stepped portions SP forming the first and second surfaces IS1-2 and IS2-2. Accordingly, the third width SP may correspond to the width of any one of the stepped portions and may be equal to or greater than about 0.01 μm and smaller than about 3 mm.

In the present exemplary embodiment, the stepped portions have the same width as each other, but they should not be limited thereto or thereby. That is, the stepped portions may have different widths from each other, and in this case, the sum of the first and second widths S1 and S2 may be a sum of the widths of the stepped portions.

The width W of the groove pattern GP may have various values depending on the radius of curvature R. In addition, each of the separation width F, the first width S1, and the second width S2 may be differently designed in accordance with the radius of curvature R.

Figure 9:
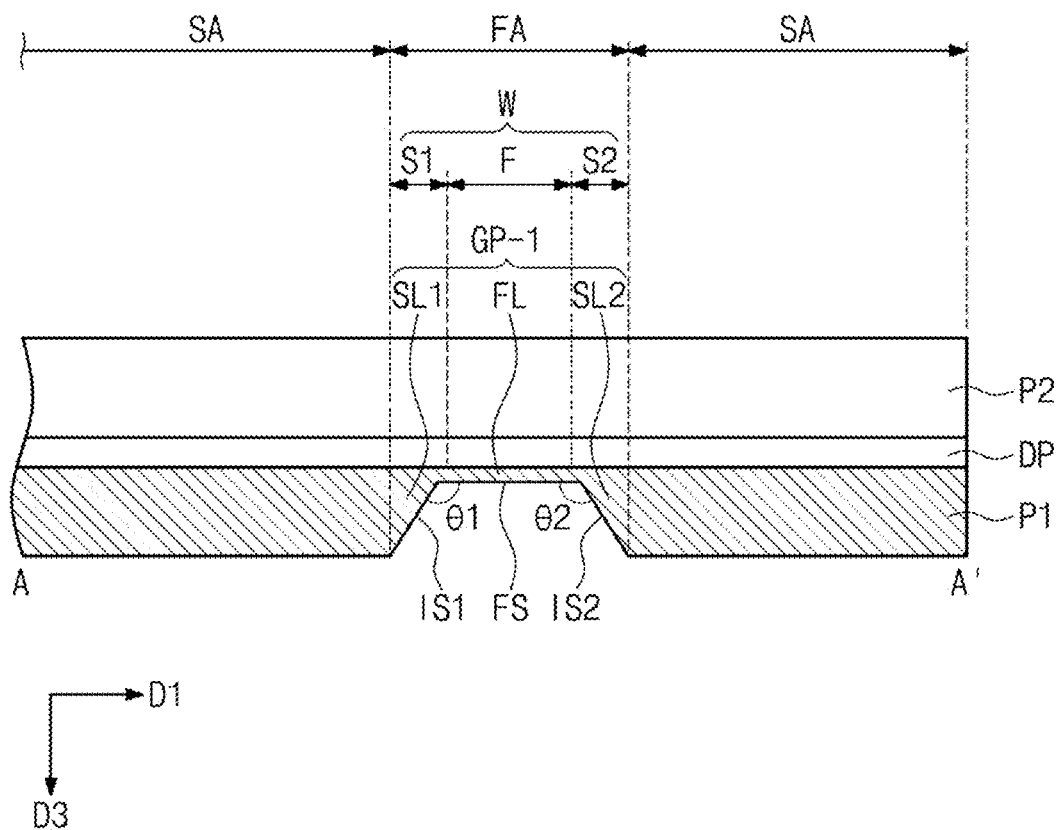
FIG. 9 is a cross-sectional view showing a flexible display device according to another exemplary embodiment of the present disclosure.
Figure 10A:
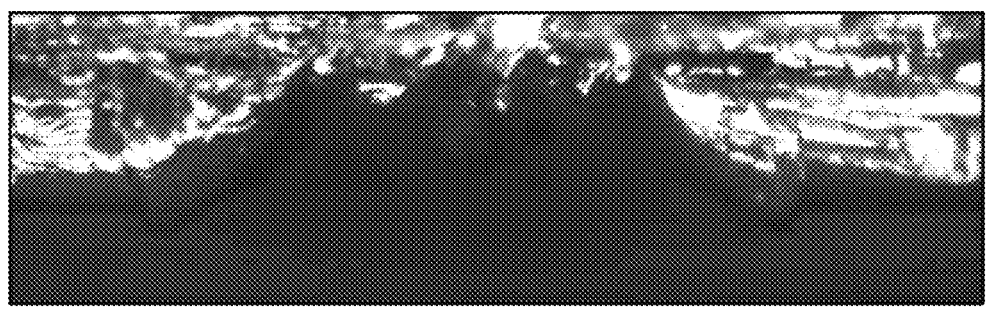
FIGS. 10A-10B are views showing portions of cross-section of a flexible display device according to an exemplary embodiment of the present disclosure.
Figure 10B:
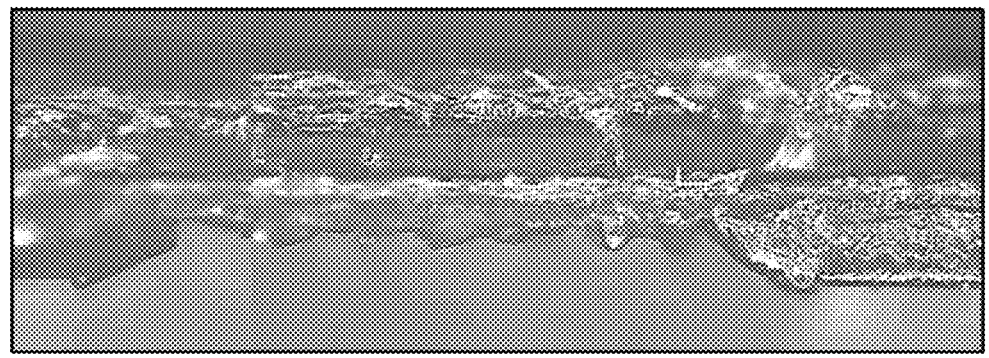

FIG. 9 is a cross-sectional view showing a flexible display device according to an exemplary embodiment of the present disclosure. FIGS. 10A-10B are views showing portions of cross-section of a flexible display device according to an exemplary embodiment of the present disclosure. For the convenience of explanation, FIG. 9 shows an area corresponding to that shown in FIG. 6A and FIGS. 10A-10B are microscope pictures showing areas each in which the groove pattern is disposed.

Hereinafter, the flexible display device will be described in detail with reference to FIGS. 9 and 10A-10B. In FIGS. 9 and 10A-10B, the same reference numerals denote the same elements in FIGS. 1 to 6B, and thus detailed descriptions of the same elements will be omitted.

Referring to FIG. 9, a groove pattern GP-1 includes a first inclined portion SL1, a second inclined portion SL2, and a flat surface portion FL. The flat surface portion FL is disposed between the first inclined portion SL1 and the second inclined portion SL2 to connect the first inclined portion SL1 and the second inclined portion SL2.

The flat surface portion FL makes contact with a surface of the flexible display panel DP. The flat surface portion FL may be substantially parallel to the surface of the flexible display panel DP. The flat surface portion FL may have a thickness smaller than a thickness of each of the first and second inclined portions SL1 and SL2.

The flat surface portion FL may be a portion of the first outer member P1. For instance, in a case that the first outer member P1 includes a base substrate and an adhesive member adhering the base substrate and the flexible display panel DP, the flat surface portion FL may serve as the adhesive member. As another example, the flat surface portion FL may be the adhesive member and a portion of the base substrate. In this case, the flat surface portion FL, the first inclined portion SL1, and the second inclined portion SL2 may have an integral shape.

The groove pattern GP-1 may have a shape defined by the first inclined surface IS1, the second inclined surface IS2, and the flat surface FS. In this case, the flat surface FS may correspond to a surface of the flat surface portion FL. Accordingly, the separation width F in Formula 1 may correspond to a width in the first direction D1 of the flat surface portion FL.

As shown in FIGS. 9 and 10A-10B, the flat surface FS may have various shapes. For instance, the flat surface FS may be a substantially flat surface as shown in FIG. 9. As another example, the flat surface FS may have a rough surface as shown in FIGS. 10A-10B.

In the flexible display device according to the present exemplary embodiment, the groove pattern GP-1 may be defined by removing only a portion of the first outer member P1. The flat surface portion FL may serve as a protective layer covering the surface of the flexible display panel DP. Thus, the groove pattern GP-1 may be stably formed without damaging the flexible display panel DP.

Figure 11:
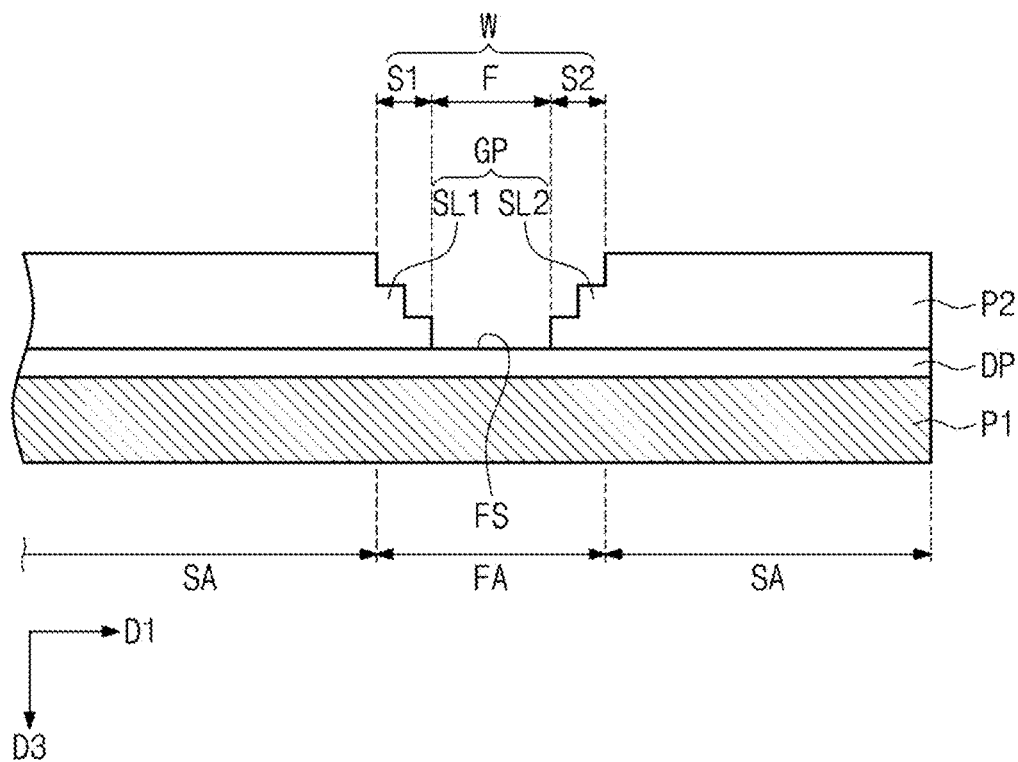
FIG. 11 is a cross-sectional view showing a flexible display device according to an exemplary embodiment of the present disclosure.

FIG. 11 is a cross-sectional view showing a flexible display device according to an exemplary embodiment of the present disclosure.

Referring to FIG. 11, the second outer member P2 is disposed on the flexible display panel DP and includes a groove pattern GP formed in the folding area FA. The groove pattern GP includes a first inclined portion SL1 and a second inclined portion SL2. The groove pattern GP has a shape defined by a flat surface FS, a first surface of the first inclined portion SL1, and a second surface of the second inclined portion SL2. Accordingly, the groove pattern GP may have a plurality of stepped portions.

The groove pattern GP includes the flat surface FS and inclined portions SL connected to the flat surface FS and symmetrical with each other about the flat surface FS.

The flat surface FS is defined by removing a portion of the second outer member P2 or by minimizing a thickness of the second outer member P2.

The width W of the groove pattern GP is equal to a sum of the width F of the flat surface FS and the widths S1 and S2 of the first and second inclined portions SL1 and SL2. The width W of the groove pattern GP may be differently designed depending on the radius of curvature R. In addition, the width F of the flat surface FS and the first and second widths S1 and S2 of the first and second inclined portions SL1 and SL2 may have various values in accordance with the radius of curvature R.

Here, when an external force is applied to the flexible display device in order to fold the flexible display device in the direction opposite to the third direction D3, the first outer member P1 disposed at an outer side of the folding area FA is applied with a tensile stress and the second outer member P2 disposed at an inner side of the folding area FA is applied with a compression stress. Accordingly, the groove pattern GP is formed in the folding area FA of the second outer member P2 in order to remove or reduce the compression stress applied to the second outer member P2. When the flexible display device is folded, the groove pattern GP is located at a position at which the compression stress becomes maximum in the folding area FA.

Figure 12:
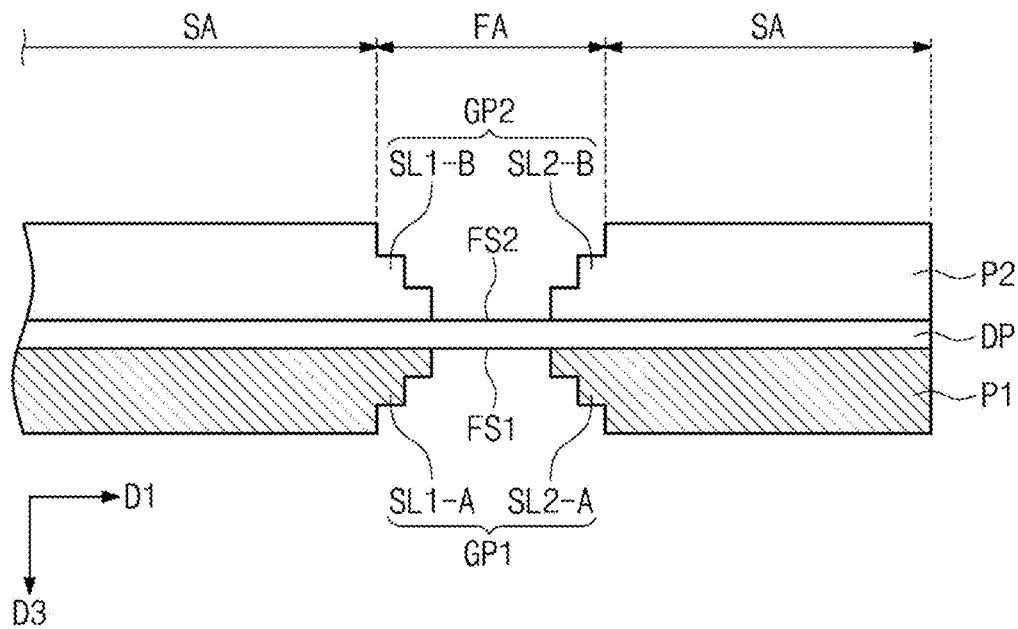
FIG. 12 is a cross-sectional view showing a flexible display device according to an exemplary embodiment of the present disclosure.

FIG. 12 is a cross-sectional view showing a flexible display device according to another exemplary embodiment of the present disclosure.

Referring to FIG. 12, the first outer member P1 is disposed under the flexible display panel DP and includes a first groove pattern GP1 formed in the folding area FA. The second outer member P2 is disposed on the flexible display panel DP and includes a second groove pattern GP2 formed in the folding area FA.

The first groove pattern GP1 includes a first lower inclined portion SL1-A and a second lower inclined portion SL2-A. The first groove pattern GP1 has a shape defined by a first surface of the first lower inclined portion SL1-A, a second surface of the second lower inclined portion SL2-A, and a first flat surface FS1.

The first flat surface FS1 is defined by removing a portion of the first outer member P1 or by minimizing a thickness of the first outer member P1. In this case, the first flat surface FS1 may be defined by a portion, which is exposed by the first lower inclined portion SL1-A and the second lower inclined portion SL2-A, of the surface of the flexible display panel DP.

The second groove pattern GP2 includes a first upper inclined portion SL1-B and a second upper inclined portion SL2-B. The second groove pattern GP2 has a shape defined by a first surface of the first upper inclined portion SL1-B, a second surface of the second upper inclined portion SL2-B, and a second flat surface FS2.

The second flat surface FS2 is defined by removing a portion of the second outer member P2 or by minimizing a thickness of the second outer member P2. In this case, the second flat surface FS2 may be defined by a portion, which is exposed by the first upper inclined portion SL1-B and the second upper inclined portion SL2-B, of the other surface of the flexible display panel DP.

Meanwhile, according to the present exemplary embodiment, the second groove pattern GP2 may be disposed in an area overlapped with the first groove pattern GP1 when viewed in a plan view. Accordingly, the first flat surface FS1 and the second flat surface FS2 may respectively correspond to portions, which face each other, of the surface and the other surface of the flexible display panel DP. However, according to another embodiment, the second groove pattern GP2 may be disposed in an area not overlapped with the first groove pattern GP1 when viewed in a plan view.

Each of the first lower inclined portion SL1-A, the second lower inclined portion SL2-A, the first upper inclined portion SL1-B, and the second upper inclined portion SL2-B may have a step pattern defined by stepped portions. Each of the first lower inclined portion SL1-A, the second lower inclined portion SL2-A, the first upper inclined portion SL1-B, and the second upper inclined portion SL2-B may have various shapes, but it should not be limited thereto or thereby.

As described above, since the first groove pattern GP1 and the second groove pattern GP2 are respectively formed in the first outer member P1 and the second outer member P2 in the folding area FA, a neutral plane exists in the flexible display panel DP. Therefore, although the flexible display device is folded in the third direction D3 or the direction opposite to the third direction D3, the stress applied to the flexible display panel DP is minimized. Thus, the flexible display panel DP may be prevented from being damaged.

Figure 13:
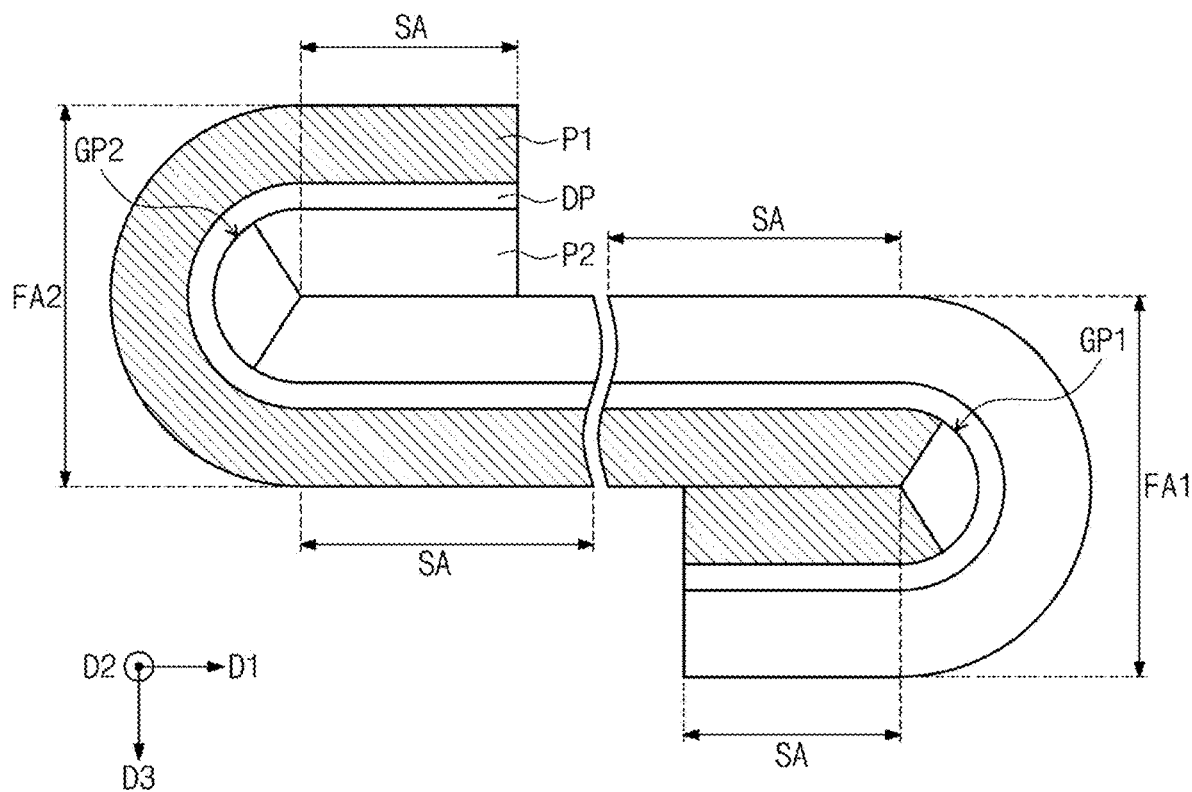
FIG. 13 is a cross-sectional view showing a flexible display device that is folded according to another exemplary embodiment of the present disclosure.

FIG. 13 is a cross-sectional view showing a flexible display device that is folded according to another exemplary embodiment of the present disclosure.

The flexible display device shown in FIG. 13 includes two folding areas FA1 and FA2 and four peripheral areas SA adjacent to the folding areas FA1 and FA2.

The flexible display device includes a flexible display panel DP, a first outer member P1 disposed on one surface of the flexible display panel DP, and a second outer member P2 disposed on the other surface of the flexible display panel DP.

The first outer member P1 is disposed under the flexible display panel DP and includes a first groove pattern GP1 formed in the first folding area FA1. The second outer member P2 is disposed on the flexible display panel DP and includes a second groove pattern GP2 formed in the second folding area FA2.

The flexible display panel DP is folded in the third direction D3 in the first folding area FA1 and folded in the direction opposite to the third direction D3 in the second folding area FA2. Here, the flexible display panel DP is folded at about 180 degrees, but it should not be limited thereto or thereby. In addition, the first groove pattern GP1 and the second groove pattern GP2 have the same shape as shown in FIG. 11, but the first groove pattern GP1 and the second groove pattern GP2 may have different shapes according to embodiments. Further, the width of the first groove pattern GP1 may be different from the width of the second groove pattern GP2, and thus the folding degree of the flexible display panel DP may be varied.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A flexible display device comprising:
    a flexible display panel comprising a folding area and a peripheral area; and
    a first outer member facing a surface of the flexible display panel, overlapping the folding area and the peripheral area in a plan view, and comprising a first groove pattern extending in a first direction at the folding area,
    wherein the first groove pattern consists of:
        a first inclined portion having a first surface inclined to the surface of the flexible display panel at an obtuse angle relative to the surface of the flexible display panel;
        a second inclined portion spaced apart from the first inclined portion in a second direction crossing the first direction, the second inclined portion having a second surface inclined to the surface of the flexible display panel at an obtuse angle relative to the surface of the flexible display panel; and
        an exposed portion disposed between the first inclined portion and the second inclined portion and defined by a portion of the display panel exposed to the outside from the first member, and
    wherein the folding area overlaps only one of the first groove pattern and does not overlap any additional groove patterns.

2. The flexible display device of claim 1, wherein a portion of a neutral plane is located outer of the first outer member at the folding area.

3. The flexible display device of claim 2, wherein the neutral plane is located in the flexible display panel at the folding area.

4. The flexible display device of claim 3, wherein the first inclined portion and the second inclined portion expose the part of the surface of the flexible display panel, and the first groove pattern is defined by the first inclined portion, the second inclined portion, and the part of the surface of the flexible panel.

5. The flexible display device of claim 3, wherein the first groove pattern is defined by the first inclined portion, the second inclined portion, and the exposed portion.

6. The flexible display device of claim 2, wherein an inclined plane extends from the portion of the neutral plane in a direction generally along one selected from the first surface and the second surface.

7. The flexible display device of claim 1, further comprising a second outer member facing another surface of the flexible display panel,
   wherein the flexible display panel is between the first outer member and the second outer member.

8. The flexible display device of claim 7,
   wherein the second outer member comprises a second groove pattern overlapping the first groove pattern in a plan view, and
   wherein a neutral plane is located between the first outer member and the second outer member at the folding area.

9. The flexible display device of claim 1, wherein at least one of the first surface or the second surface is curved.

10. The flexible display device of claim 7, wherein the second outer member comprises a second groove pattern.

* * * * *